Dec. 30, 1952 J. J. ROARK 2,623,947

PHASE CORRECTION FILTER CIRCUIT

Filed Sept. 29, 1947 2 SHEETS—SHEET 1

James J. Roark Inventor

By W. O. Hilman Attorney

Dec. 30, 1952 J. J. ROARK 2,623,947

PHASE CORRECTION FILTER CIRCUIT

Filed Sept. 29, 1947 2 SHEETS—SHEET 2

James J. Roark Inventor

By W. O. Heilman Attorney

Patented Dec. 30, 1952

2,623,947

UNITED STATES PATENT OFFICE 2,623,947

PHASE CORRECTION FILTER CIRCUIT

James J. Roark, Tulsa, Okla., assignor to Standard Oil Development Company, a corporation of Delaware Application September 29, 1947, Serial No. 776,807

5 Claims. (Cl. 178—44)

The present invention relates to a filter circuit having certain amplitude and frequency characteristics. It relates particularly to a filter circuit which is substantially a phase correction circuit permitting control of phase angle characteristics substantially independently of the amplitude characteristics of the filter.

In the design of filter circuits for radio and communication work, it is frequently desirable to control phase angle characteristics versus frequency independently of the amplitude versus frequency characteristics. At the same time it is frequently useful to maintain a linear phase shift characteristic. A circuit having a linear phase shift characteristic with respect to frequency provides a constant time delay effect for all frequencies. Consequently, particularly when transients have to be filtered, it is desirable to use such a filter characteristic. The present invention relates to a filter circuit having substantially linear phase shift characteristics and having means for controlling the phase angle characteristics independently of the amplitude characteristics. In particular the filter circuit of the present invention permits adjustment as desired of the phase angle intercept.

In accordance with the present invention the electrical impulse to be filtered is first passed through a filter, amplified, and is then added to a portion of the input voltage. This may be thought of as feeding back a portion of the amplified filter output.

The nature and objects of the present invention will be fully understood from the following description in connection with the accompanying drawings in which:

Figure 1 diagrammatically illustrates one embodiment of the filter circuit of my invention;

Figure 3:
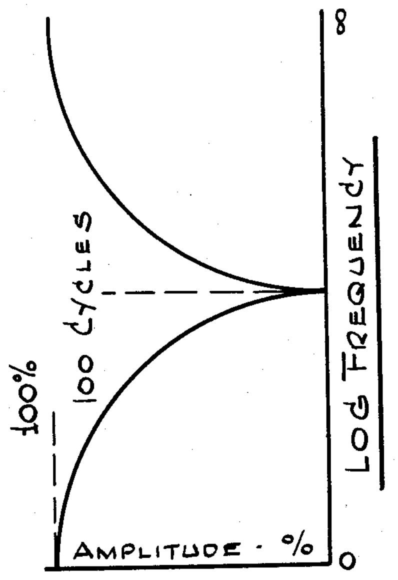
Figure 3 shows the amplitude versus frequency characteristics of the filter of Figure 2.
Figure 1:
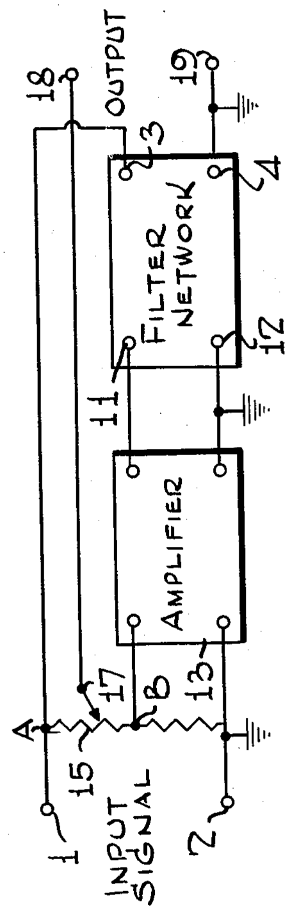
Figure 2:
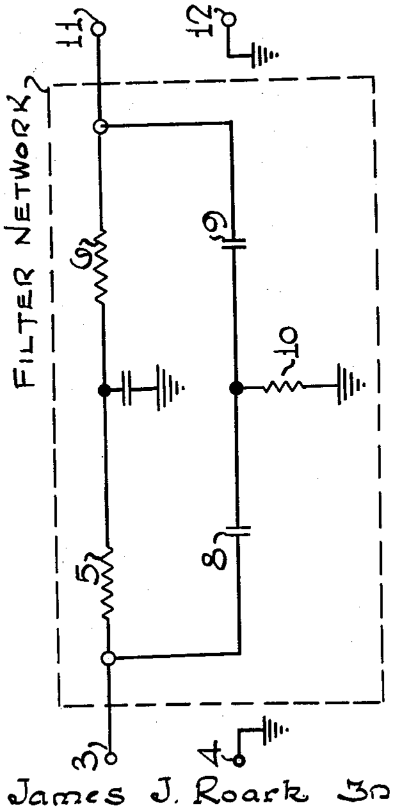
Figure 2 shows a suitable filter network to be employed in the filter circuit of Figure 1.
Figure 5:
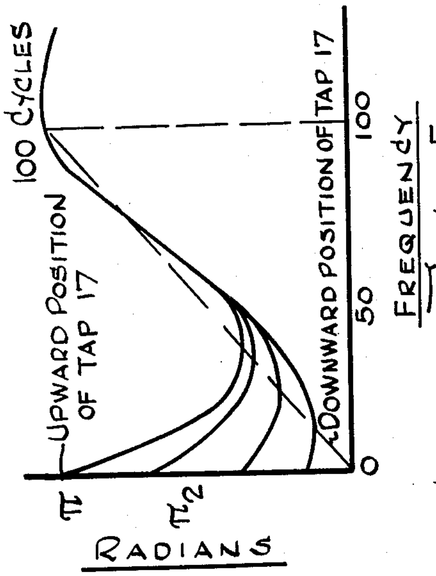
Figure 5 shows the phase shift characteristics versus frequency for the complete filter circuit of Figure 1.
Figure 6:
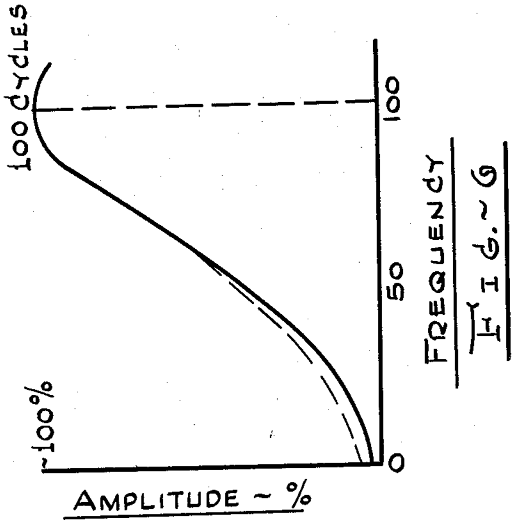
Figure 6 shows the amplitude characteristic versus frequency for the complete filter circuit of Figure 1.
Figure 4:
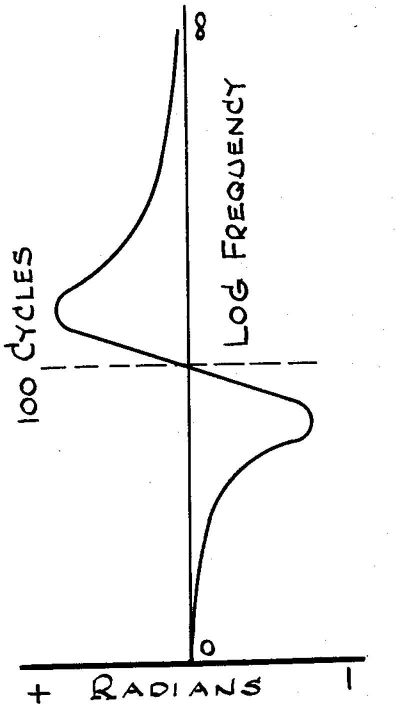
Figure 4 shows the phase shift characteristics versus frequency of the filter of Figure 2.

Referring now to the circuit of Fig. 1, the signal to be filtered is applied across the terminals 1 and 2 of the complete filter circuit and is then impressed on the input terminals 3 and 4 of the filter network. The filter network is shown in Fig. 2 and may be a parallel-T type filter which is the equivalent of a Wein bridge circuit. This filter is described in the Journal of the Acoustical Society of America, vol. 16, No. 4, pages 275–276. The input of the filter impressed across terminals 3 and 4 of Fig. 2 passes in parallel through the series connected resistor 5 and resistor 6 connected at their midpoint to ground through condenser 7 and through the series connected condensers 8 and 9 connected at their midpoint through resistor 10 to ground. The output voltage of the filter obtained at terminals 11 and 12 is represented by Fig. 3 of the drawings. In Fig. 3 is shown the sharp amplitude versus frequency characteristics of the filter in which the null may be fixed at any desired frequency, for example, 100 cycles. It will thus be recognized that the type of filter applicable to this invention is what is known as a band elimination type filter. In Figure 4 is represented the phase angle characteristic or the filter versus frequency which passes through the zero phase shift intercept at the same frequency for which the amplitude is a minimum, for example, 100 cycles. In the particular embodiment illustrated it was desired to obtain a linear phase shift characteristic over the frequencies from about 0 to 100 cycles, particularly 50 to 100 cycles. Therefore interest was primarily in the lower frequency range of the characteristics shown in Figures 3 and 4 from 0 to 100 cycles. The output of the filter network is impressed on a linear frequency response amplifier indicated by the block 13 in Figure 1. This may be a simple one stage resistance coupled amplifier, having a substantially linear amplitude versus frequency characteristic from 100 cycles down to a few cycles per second. The amplifier serves to amplify the filtered output, to reverse the phase of the signal by 180°, and also serves to isolate the filtered signals by preventing return of the input signal through the output terminals of the amplifier and filter. The amplified output is impressed on the midpoint of a voltage divider consisting of a potentiometer 15 and a resistor 16 connected in series across the input terminals of the filter circuit. The variable output tap 17 of the potentiometer is connected to one terminal of the output of the filter circuit. The other terminal of the output is simply the ground return. As illustrated, the filtered output signal of this filter circuit may be obtained at the terminals 18 and 19. The phase angle versus frequency response of the complete filter circuit; obtained at the output terminals of the filter, is shown in Fig. 5. The family of curves represented are obtained by varying the position of the variable output tap 17 from a position favoring the signal voltages impressed on the input terminals 1 and 2 to the voltages obtained at the output of the amplifier. As will be observed, when the variable tap of potentiometer 15 is in an upward position, favoring the addition of input voltages at point A, the curve will have an intercept which may be substantially $\pi$ providing a sharp dip in the curve at a frequency less than 50 cycles. Thereafter the curve is substantially linear up to 100 cycles. If on the other hand, the variable tap of potentiometer 15 is positioned in a downward position to favor the addition of voltages from point B, a substantially linear phase shift curve will be obtained as shown in the dotted line having an intercept at substantially 0. Any desired phase angle intercept may be readily obtained between these extremes by varying the position of the variable mid-tap 17. In Fig. 6 is represented the amplitude versus frequency characteristics of the filter circuit described. The heavy line represents the amplitude characteristic when the variable output tap 17 is in an upward position giving an intercept of $\pi$ on Fig. 5. The dashed curve of Fig. 6 represents the amplitude characteristic of the filter circuit when the variable tap of potentiometer 15 is in a downward position resulting in the dashed line curve of Fig. 5. These are the two extreme positions of the variable tap 17 as used in this circuit. It will be observed that little variation in the amplitude characteristics of the circuit results with variation of the phase angle intercept over the range shown.

As described, the filter circuit of my invention provides a substantially linear phase shift versus frequency characteristics over a desired range of frequencies. In the embodiment of the invention described, the range was broadly 0–100 cycles and particularly 50–100 cycles. At the same time the circuit permits convenient adjustment of the phase angle intercept as desired; in the embodiment described, between 0 and $\pi$ radians. This adjustment of the phase angle intercept causes substantially no change in the amplitude versus frequency response of the circuit.

The circuit of my invention will find application in many phases of the electronic and radio arts, particularly wherein it is necessary to filter transients. The circuit has proved especially useful in seismological explorations, providing a linear phase characteristic for the filtering of the transients received by geophones responsive to seismic disturbances. The effect in such an application is to provide a constant time delay effect for all frequencies of such a transient.

Having now fully described my invention, I claim:

1. In a method for filtering and amplifying an input signal voltage, the steps of passing said signal voltage through a band-elimination type filter, amplifying the signal output of the filter, combining a part of the amplified signal voltage with a part of the input signal voltage to obtain the output signal voltage, and controlling the low frequency phase angle intercept of the output signal voltage with respect to the input signal voltage by varying by voltage divider action the quantities of amplified signal voltage and of input signal voltage that are combined, said voltage divider action being obtained by shunting a fixed resistor across the amplified signal voltage and by shunting the same fixed resistor, in series with a potentiometer, across the input signal voltage, the output signal voltage being taken from the output tap of the potentiometer.

2. Method according to claim 1 in which the filter employed is a parallel-T type filter.

3. A filter-amplifier circuit comprising, in combination, a band elimination type filter, connected to the input of the circuit, an amplifier connected to the output of the filter, a fixed resistor and a potentiometer connected in series across the input of the circuit, the said fixed resistor also being connected across the output of the amplifier, the output from the circuit being obtained from the output tap of the potentiometer and from the common ground of the circuit.

4. Filter-amplifier circuit according to claim 3 in which the filter is a parallel-T type filter.

5. Filter-amplifier circuit according to claim 3 in which the filter has a null frequency of about 100 cycles.

JAMES J. ROARK.

REFERENCES CITED

The following references are of record in the file of this patent:

UNITED STATES PATENTS

| Number | Name | Date |
|---|---|---|
| 2,231,955 | Schrader | Feb. 18, 1941 |
| 2,382,097 | Purington | Aug. 14, 1945 |